US007657191B2

(12) United States Patent  
Killmeyer et al.

(10) Patent No.: US 7,657,191 B2  
(45) Date of Patent: Feb. 2, 2010

(54) VARIABLE BANDWIDTH TRANSIMPEDANCE AMPLIFIER WITH ONE-WIRE INTERFACE

(75) Inventors: Scott Killmeyer, Calabasas, CA (US); Lawrence Choi, Downey, CA (US); Yanzhen Xu, Camarillo, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 645 days.

(21) Appl. No.: 11/060,061

(22) Filed: Feb. 16, 2005

(65) Prior Publication Data

US 2006/0045531 A1    Mar. 2, 2006

Related U.S. Application Data

(60) Provisional application No. 60/604,337, filed on Aug. 25, 2004.

(51) Int. Cl.
*H04B 10/06* (2006.01)

(52) U.S. Cl. .................. 398/202; 398/208; 398/209; 250/214 A; 250/214 LA; 250/214 AG; 330/59; 330/308; 385/88; 385/89; 385/92; 385/93

(58) Field of Classification Search ............... 398/202, 398/208, 209, 210, 213, 214, 135, 138, 139, 398/164, 197, 128, 130, 212; 250/214 A, 250/214 R, 214 AG, 214 SW, 214 LA, 214 C; 330/59, 308; 385/88, 89, 90, 92, 93
See application file for complete search history.

(56) References Cited

U.S. PATENT DOCUMENTS

| | | | |
|---|---|---|---|
| 5,382,920 A * | 1/1995 | Jung ........................... 330/308 |
| 5,508,650 A | 4/1996 | Grimm et al. |
| 5,612,633 A | 3/1997 | Kean |
| 5,864,416 A * | 1/1999 | Williams ..................... 398/202 |
| 6,084,478 A | 7/2000 | Mayampurath |
| 6,218,905 B1 | 4/2001 | Sanders et al. |
| 6,333,804 B1 * | 12/2001 | Nishiyama et al. .......... 398/202 |
| 6,487,674 B1 | 11/2002 | White et al. |
| 6,862,322 B1 * | 3/2005 | Ewen et al. .................. 375/316 |
| 7,062,164 B2 * | 6/2006 | Ames et al. .................... 398/25 |
| 7,068,951 B2 * | 6/2006 | Miremadi .................... 398/202 |
| 7,073,959 B2 * | 7/2006 | Baek et al. ..................... 385/92 |
| 2004/0145799 A1 * | 7/2004 | Sedic ........................... 359/325 |

OTHER PUBLICATIONS

Castillo, et al. "A BiCMOS Transimpedance Amplifier For High-Frequency Communication Systems", Instituto Tecnológico de Chihuahua, ELECTRO 2001 (p. 297-300).

Palojärvi, et al., "A Variable Gain Transimpedance Amplifier Channel With A Timing Discriminator For A Time-Of-Flight Laser Radar", Proceedings of the 23nd European Solid-State Circuits Conference, Southampton, UK, Sep. 16-18, 1997 (4 pgs.).

(Continued)

*Primary Examiner*—Hanh Phan  
(74) *Attorney, Agent, or Firm*—Klein, O'Neill & Singh, LLP (57) ABSTRACT

A bandwidth adjustable transimpedance amplifier. The bandwidth adjustable transimpedance amplifier includes a feedback path with a selectable resistance. The bandwidth adjustable transimpedance amplifier is preferably implemented with a photodiode in a five pin package for an optical transceiver system, with a single pin providing a monitor out function and a rate select input.

11 Claims, 4 Drawing Sheets

OTHER PUBLICATIONS

Yet2.com, TechPak, "Tuning Optical Communications Receiver By Controlling Drain Current Input To Variable Transconductance Fet Stage Of Variable Bandwidth Transimpedance", http://www.yet2.com/app/utility/external/indextechpak/25517, Sep. 14, 2002 (1 pg.).

* cited by examiner

VARIABLE BANDWIDTH TRANSIMPEDANCE AMPLIFIER WITH ONE-WIRE INTERFACE

CROSS-REFERENCE TO RELATED APPLICATION(S)

This application claims the benefit of the filing date of U.S. Provisional Patent Application No. 60/604,337, filed Aug. 25, 2004, the disclosure of which is incorporated by reference herein.

BACKGROUND

The present invention relates generally to an optical transceiver, and more particularly to a receiver optical subassembly with an adjustable bandwidth transimpedance amplifier in an optical transceiver.

Optical transceivers are often used in optical communication systems. Optical transceivers transmit and receive optical information generally at very high data rates. In many applications the optical information is formed by modulating light from a laser, either by direct modulation of the laser or by using a separate modulator, such as an electroabsorbtion modulator or a lithium niobate modulator. The modulated light is passed over a fiber optic line, often simultaneously with light from other lasers at varying wavelengths, and received by a receiver.

The receiver detects the received light, generally using a photodetector such as a photodiode. The photodetector converts the received modulated light signal to an electrical signal. Electrical signals produced by photodetectors are generally very small current signals. Transformation of the current to a voltage and amplification of the voltage is generally performed to provide a signal which may be used by further downstream electrical processing components. Amplification of the signal is often problematic as the amplification often distorts and adds noise to the signal.

Transimpedance amplifiers are often used to convert the small current signal provided by the photodetector into an amplified voltage. Transimpedance amplifier design often involves a number of trade-offs, where improvement in one area results in degradation in another. For example, improvement in output signal quality may sometimes be achieved by limiting the useful bandwidth of the device. Accordingly, often transimpedance amplifiers are optimized for a specific bandwidth. Unfortunately, the use of a transimpedance amplifier optimized for a specific bandwidth generally implies that a receiver unit using the transimpedance amplifier may only be used in a system receiving data approximate the specific bandwidth. However, optical communication systems may provide data at a number of different data rates. Therefore, different receiver units with different transimpedance amplifiers are often required for the different data rates available for optical communication systems. This reduces flexibility in the use of receiver units and increases inventory stocking costs.

BRIEF SUMMARY OF THE INVENTION

The invention provides a receiver optical subassembly for a transceiver with an adjustable bandwidth transimpedance amplifier.

In one aspect the invention provides a five pin package including a photodiode and a transimpedance amplifier, comprising a housing with a window; a die within the housing; five pins coupled to the housing and electrically coupled to the die, a first pin of the five pins providing a ground pin and a second pin of the five pins providing a power pin; a photodiode within the housing and approximate the window, the photodiode positioned to receive light passing through the window; the die including an adjustable bandwidth transimpedance amplifier, with the photodiode electrically coupled to an input of the adjustable bandwidth transimpedance amplifier; the die further including a further amplifier with an input electrically coupled to an output of the adjustable bandwidth transimpedance amplifier and with two outputs forming a differential output, the differential output being coupled to a third pin of the five pins and a fourth pin of the five pins; and a fifth pin of the five pins operatively coupled to a the adjustable bandwidth transimpedance amplifier to provide adjustment of bandwidth of the adjustable bandwidth transimpedance amplifier.

In another aspect the invention provides a five pin package including a transimpedance amplifier, comprising a housing; a die within the housing, the die including circuitry including at least one transimpedance amplifier; five pins coupled to the housing and electrically coupled to the die; at least one of the five pins providing both a signal path for a signal indicative of current received by the transimpedance amplifier and a signal path for a signal for modifying an aspect of operation of the circuitry.

In another aspect the invention provides an adjustable bandwidth transimpedance amplifier comprising an amplifier receiving a current signal; a feedback path coupling an input and an output of the amplifier; and a selectable resistance in the feedback path.

In yet a further aspect the invention provides a transceiver receiver optical subassembly including an adjustable bandwidth transimpedance amplifier, comprising a photodiode configured to receive an optical data signal; an adjustable bandwidth transimpedance amplifier with an input coupled to an output of photodiode; a further amplifier with an input coupled to an output of the adjustable bandwidth transimpedance amplifier and a dual output providing an output differential signal.

A further aspect provides an optical transceiver comprising a photodiode; an adjustable bandwidth transimpedance amplifier with an input coupled to an output of the photodiode; a post-amp amplifier coupled to an output of the adjustable bandwidth transimpedance amplifier; processing circuitry coupled to at least one output of the post-amp amplifier; laser driver circuitry receiving a data signal; and a laser diode coupled to the laser driver.

Another aspect of the invention provides a method of operating a receiver optical subassembly, comprising generating a current signal in response to a data bearing incoming light signal; providing the current signal to a transimpedance amplifier; forming a signal indicative of the current signal; placing the signal indicative of the current signal on a monitor/select pin; receiving a control signal on the monitor/select pin; adjusting an aspect of the transimpedance amplifier based on the control signal.

These and other aspects of the invention are more readily understood on review of the figures and text herein.

DETAILED DESCRIPTION

Figure 1:
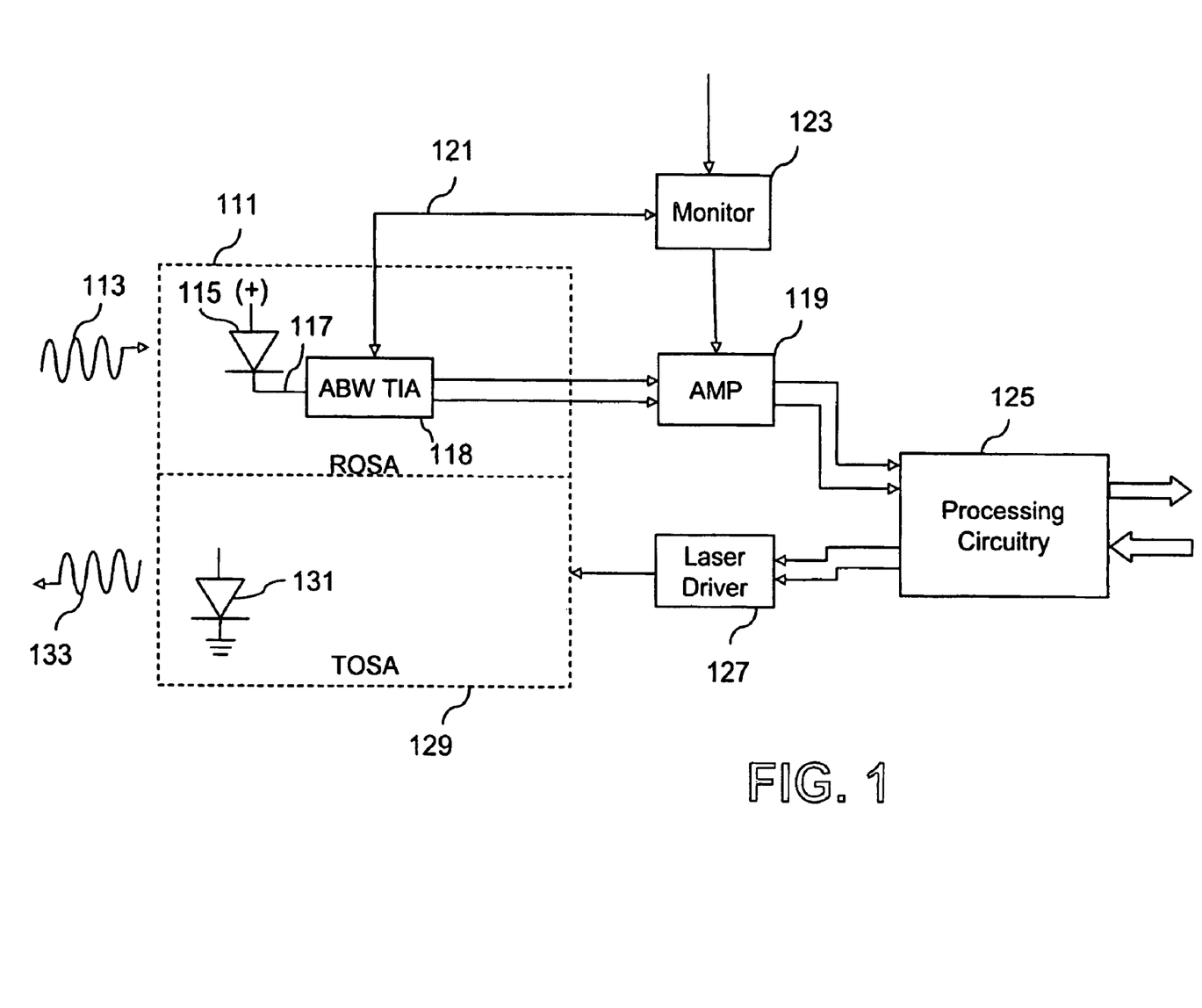
FIG. 1 illustrates a block diagram of a transceiver with an adjustable bandwidth transimpedance amplifier in accordance with aspects of the invention.

FIG. 1 is a block diagram of a transceiver with an adjustable bandwidth transimpedance amplifier in accordance with aspects of the invention. A receiver optical subassembly (ROSA) 111 receives an optical signal 113. The optical signal impinges on a photodetector 115 in the ROSA, generating a current signal on an output 117 of the photodetector. The photodetector of FIG. 1 provides a single output, although in various embodiments a differential output is provided.

The current signal is received by an adjustable bandwidth transimpedance amplifier block 118. The adjustable bandwidth transimpedance amplifier block converts the current signal to a voltage signal and amplifies the voltage signal. The adjustable bandwidth transimpedance amplifier block generates a differential voltage signal, which is provided to with a post-amp amplifier 119. In some embodiments the adjustable bandwidth transimpedance amplifier block provides a non-differential output signal, and in some embodiments the post-amp is within the ROSA.

The post-amp amplifies the differential signal provided by the adjustable bandwidth transimpedance amplifier. The amplified differential signal is received by processing circuitry 125. The processing circuitry may perform various processing of the signal, such as framing, error correction, or a number of other operations. The processing circuitry thereafter provides a parallel output data stream used by further processing circuitry or possibly external devices.

The processing circuitry also receives parallel data, and processes the parallel data in preparation for output of the data. FIG. 1 illustrates processing performed on bidirectional data, although in various embodiments the processing circuitry may be split into various subparts. The processing circuitry provides a differential serial data stream to a laser driver 127. The laser driver provides a laser driver signal to a transmitter optical subassembly (TOSA) 129. The TOSA includes a laser diode 131, which in most embodiments is a vertical cavity surface emitting laser (VCSEL), but may also be a distributed feedback (DFB) laser, distributed Bragg reflector (DBR) laser, or other type of laser. The laser diode generates an output optical signal 133.

The adjustable bandwidth transimpedance amplifier block also provides a signal indicative of current generated by the photodetector. The signal is placed on a monitor/select line 121. The signal is received by a monitor unit 123.

The monitor unit forms an amplification signal based, at least in part, on the signal indicative of current generated by the photodetector. The amplification signal is used by the post-amp to determine extent of amplification of the differential signal. In many embodiments the amplification signal is set based on whether or not the photodetector is receiving an optical signal carrying data. As the photodetector generated current is often very small even with data present, it is possible that amplification by the post-amp of spurious noise signals when data is not present, e.g. during a loss-of-signal (LOS), may result in unintended effects in downstream processing circuitry.

Accordingly, in many embodiments the monitor unit includes LOS detection circuitry. The LOS detection circuitry processes the signal indicative of current generated by the photodetector, and determines if an LOS has occurred. The monitor unit forms the amplification signal based on whether an LOS has occurred, and the amplification signal is received by the post-amp. In such embodiments, generally the amplification signal indicates either that data is present and the post-amp should amplify the differential signal by a pre-defined relatively large amount, or an LOS has occurred and the post-amp should largely squelch its output.

The monitor block also receives a signal indicative of a selected rate from an external source. The selected rate is the expected data rate of data received by the photodetector. In other embodiments, however, processing circuitry of the transceiver determines the data rate of received data and provides a selected rate signal received by the monitor block.

The monitor block provides the adjustable bandwidth transimpedance amplifier block a rate select signal. As illustrated in FIG. 1, the rate select signal is provided to the adjustable bandwidth transimpedance amplifier on the same signal path as used for provision of the signal indicative of photodetector current to the monitor block.

The adjustable bandwidth transimpedance amplifier varies a circuit aspect based on the rate select signal. In some embodiments the circuit aspect is a feedback path in the transimpedance amplifier, and in some embodiments the circuit aspect is a resistance associated with the feedback path.

Figure 2:
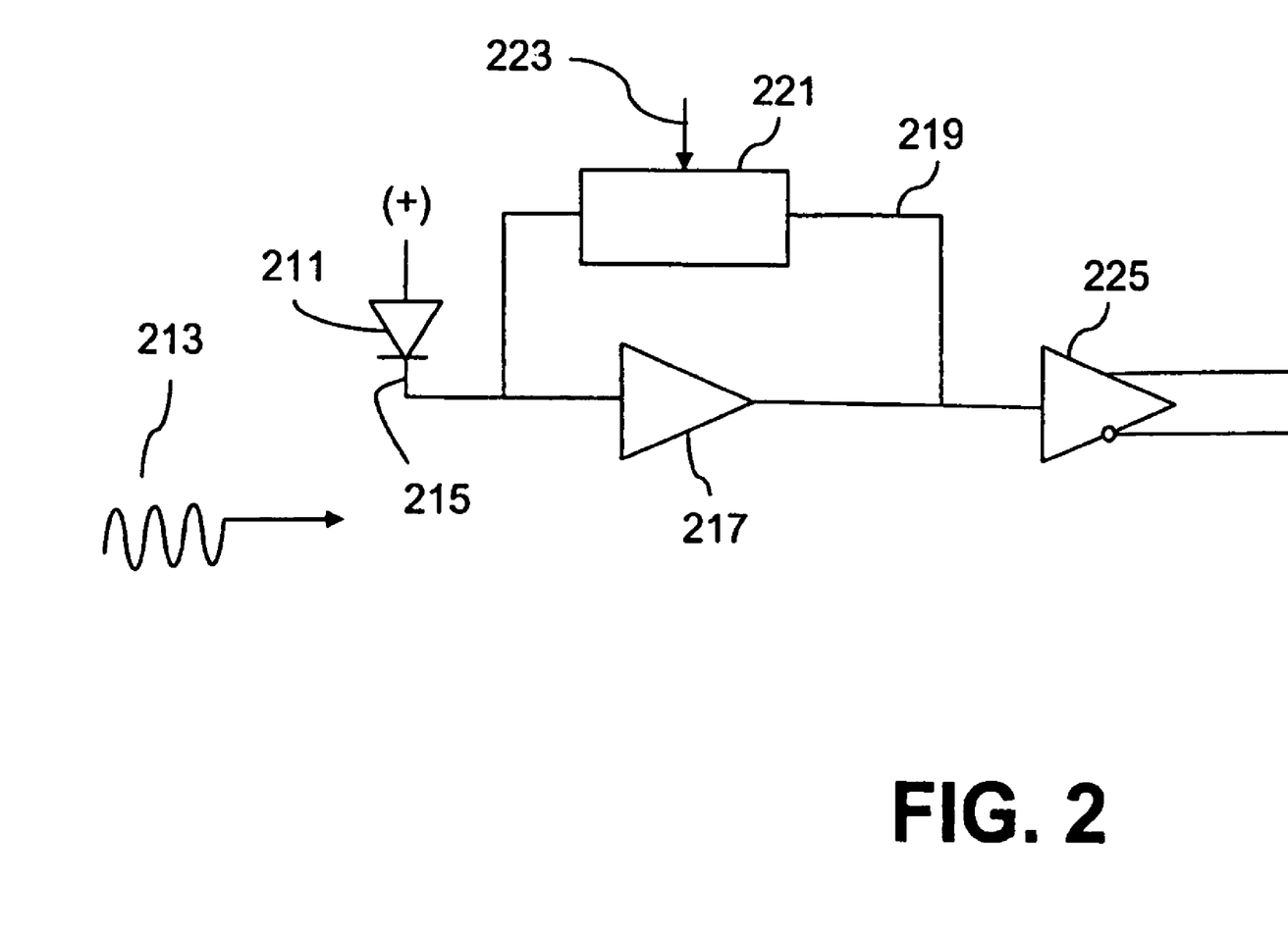
FIG. 2 is a semi-schematic of an adjustable bandwidth transimpedance amplifier in accordance with aspects of the invention.

FIG. 2 is a semi-schematic of an optical receiving circuit including an adjustable bandwidth transimpedance amplifier in accordance with aspects of the invention. A photodiode 211 receives an optical signal 213. Light in the optical signal generates a photocurrent in the photodiode. The photocurrent creates an output current on an output 215 of the photodiode. An amplifier 217 is coupled to the output of the photodiode. A feedback path 219 couples the output of the amplifier and the input of the amplifier. The feedback path includes a selectable resistance 221. The resistance of the selectable resistance is controlled by a control signal 223.

The output on the amplifier is also provided to a further amplifier 225. Although illustrated as a single amplifier, in many embodiments the further amplifier is an amplifier chain. The further amplifier amplifies the signal and provides a differential output.

In some embodiments the optical receiving circuit of FIG. 2 is provided in a housing. The housing includes a window, with the photodiode positioned within the housing so as to receive light passing through the window. A die is also within the housing, with the transimpedance amplifier, further amplifier, and associated circuitry and conductive signal paths on the die. Pins, or electrical leads, extending from the housing are electrically coupled to the die.

Figure 3:
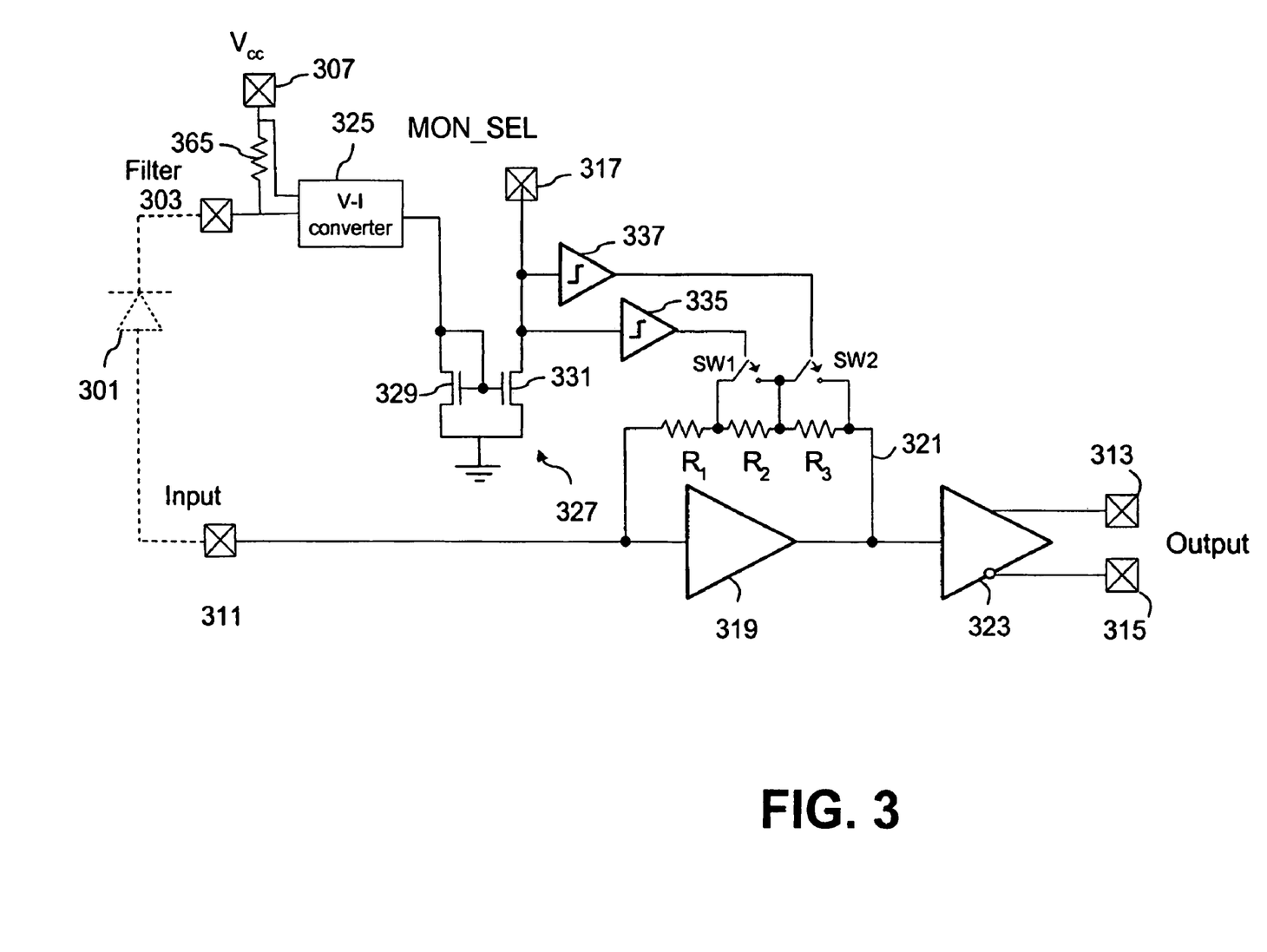
FIG. 3 is a schematic of a receiver optical sub-assembly including an adjustable bandwidth transimpedance amplifier in accordance with aspects of the invention.

FIG. 3 is a further semi-schematic showing circuitry on a die, the circuitry including a transimpedance amplifier in accordance with aspects of the invention. Preferably, the die is part of a five pin package. The die includes two output pads 313, 315 for providing a differential output signal on pins of the package containing the die. The die further includes a monitor/select (MON_SEL) pad 317, and power and ground pads (not explicitly shown), with these pads also coupled to pads of the package containing the die. The power and ground pads are coupled to active devices in the circuit, for example, in manners known to a person of skill in the art or one of ordinary skill in the art.

An input pad on the die is generally coupled to an output of a photodiode 301. As illustrated, the input pad is coupled to an anode of the photodiode. The photodiode is generally within a housing of the package, with a window allowing light to enter the housing and impinge on the photodiode. Therefore, the input pad generally provides an input current signal indicative of light received by the photodiode. The input pad is coupled to a transimpedance amplifier 319. The transimpedance amplifier is configured as an amplifier with a resistive feedback path 321. The resistive feedback path couples the input and output of the amplifier. The resistivity of the resistive feedback path is dependent on voltage on the monitor/select pad, as will be further described.

The output of the transimpedance amplifier is coupled to a further amplifier 323. In some embodiments the further amplifier is an amplifier chain. The further amplifier further amplifies the output of the transimpedance amplifier, and provides the differential output signal.

A monitor output signal, which provides an indication of the current generated by the photodiode, is often useful. A cathode of the photodiode is coupled to a filter pad of the die. In various embodiments the filter pad 303 is coupled to an off-chip filter, which in some embodiments smoothes variations in cathode photodiode current. A resister 365 is coupled between the filter pad and a $V_{cc}$ pad 307, which may be the ground pad. A voltage-to-current converter receives inputs from both ends of the resister, and converts the voltage across the resister to a current. The current is provided as an output of the voltage-to-current converter, and the current is indicative of photodiode current. The voltage-to-current converter's output is received by a current mirror 327. The current mirror is formed by two gate coupled FETS. The output of the unity gain amplifier is coupled to a drain of a first FET 329 and the gate of both the first FET and a second FET 331. The sources of the FET are coupled to ground. Drain to source current in both FETs is therefore the same, and a current through the second FET is proportional to the voltage at the output of the unity gain amplifier.

The drain of the second FET is coupled to the monitor/select pad. The monitor/select pad is also coupled to inputs of a first comparator 335 and a second comparator 337. As the comparators largely draw no current, current drawn by the monitor/select pad is equal to the current passing through the second FET. The current drawn by the monitor/select pin is therefore an indication of current generated by the photodiode and provided to the input pad.

A voltage is also applied to the monitor/select pad. In some embodiments this is accomplished by monitor circuitry external to the transimpedance amplifier. The voltage indicates a selected rate, with the selected rate being the expected data rate of data on the input pin. The first comparator has a set point lower than the second comparator. The output of the first comparator is coupled to a first switch SW1, and the output of the second comparator is coupled a second switch SW2. The switches may be implemented, for example, using transistors.

The switches are in arranged in parallel with a series resistance network formed by resistors $R_1$, $R_2$, and $R_3$. The switches and resistors are in the feedback path for the transimpedance amplifier. The first switch is parallel to $R_2$, and the second switch is parallel to $R_3$. When both the first switch and the second switch are open, the feedback path comprises resistors $R_1$, $R_2$, and $R_3$. When the first switch is closed and the second switch is open resistor $R_2$ is bypassed and the feedback path comprises resistors $R_1$ and resistor $R_3$. When both the first and second switches are closed the feedback comprises resistor $R_1$. Accordingly, the feedback path has a selectable resistance, with the resistance selectable between three resistive settings. As the bandwidth of the transimpedance amplifier is dependent on the feedback resistance, the bandwidth is selectable to one of three settings. In various embodiments further comparators, switches, and resistors are used to provide an increased number of resistive settings.

Figure 4:
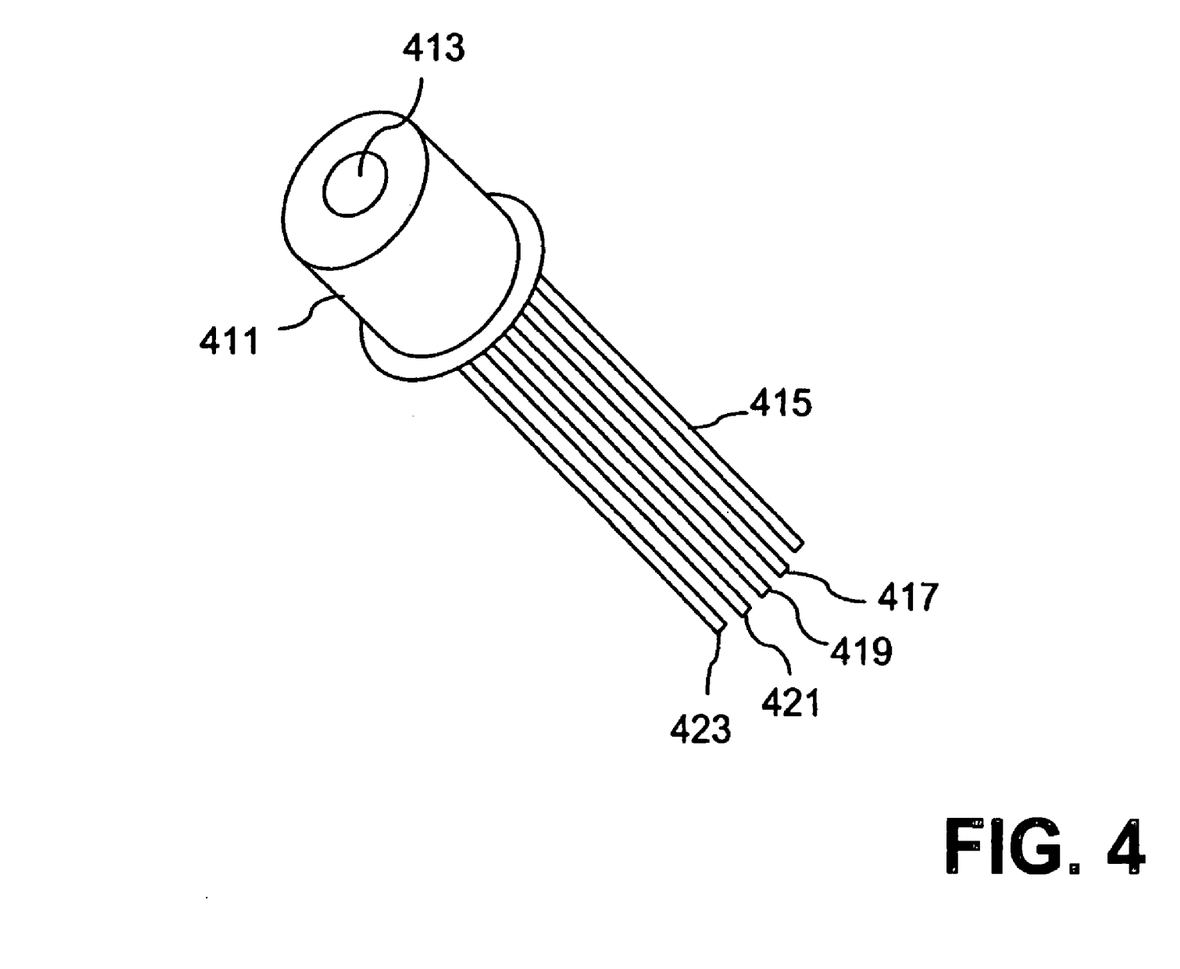
FIG. 4 is a perspective view of a five pin package including an adjustable bandwidth transimpedance amplifier in accordance with aspects of the invention.

FIG. 4 illustrates a five pin package for a receiver optical subassembly (ROSA) including a transimpedance amplifier. The transimpedance amplifier, for example, is an adjustable bandwidth transimpedance amplifier in accordance with aspects of the invention. The five pin package includes a housing 411. The housing is substantially cylindrical in shape. One end of the housing includes a window 413. The window is a largely transparent window allowing light, for example from an optical fiber, to pass into the housing. In some embodiments the window is in a shape of a concave lens, and focuses light on a point within a housing. Within the housing is a photodiode (not shown) approximate the window. Light passes through the window and impinges on the photodiode, generating a photocurrent. The photodiode is electrically coupled to a die (not shown) within the housing. The die includes semiconductor circuitry, circuit traces, contact pads, and other articles commonly used with semiconductor circuits. The die, for example, includes an adjustable bandwidth transimpedance amplifier as previously described.

A first pin 415, or electrical lead, extending from the housing is a power pin. The power pin provides a path for providing electrical power to the device. A second pin 417 is a ground pin for the device. As is understood, the ground pin may not necessarily be a particular level in all cases, other than at a generally predefined voltage level below that of the power pin. A third pin 419 and a fourth pin 421 provide a differential output. The differential output preferably corresponds to the differential form of a data signal contained in light passed through the window. A fifth pin 423 is a monitor/select pin. Current on the monitor/select pin is indicative of photocurrent generated by the photodiode. The voltage applied to the monitor/select pin provides a control signal to the device, with the control signal indicating a selected rate. As the selected rate, which indicates a data rate of incoming data, indicates a selected bandwidth, the selected rate signal can be viewed as a selected bandwidth signal.

Although the invention has been described in certain embodiments, it should be recognized that the scope of the invention is defined by the claims and insubstantial variations thereof.

What is claimed is:

1. An adjustable bandwidth transimpedance amplifier comprising:
   an amplifier configured to receive a current signal;
   a feedback path coupling an input and an output of the amplifier; and
   a selectable resistance in the feedback path, resistance of the selectable resistance controlled by a control signal, the selectable resistance comprises a plurality of resistances, the plurality of resistances switchably coupled to the feedback path, the plurality of resistances comprising a plurality of resistors, the plurality of resistors coupled in series and at least some of the resistors each having a switch coupled in parallel, the control signal determining whether the switches are open or closed, the control signal being coupled to a plurality of comparators, and an output of each comparator is coupled to a corresponding switch;
   wherein the control signal is a voltage signal;
   wherein a current on a signal path is an indication of the current signal provided to the adjustable bandwidth transimpedance amplifier; and
   wherein the current on the signal path is provided by a current mirror.

2. The adjustable bandwidth transimpedance amplifier of claim 1 wherein the current mirror is coupled to an output of the amplifier having an input receiving the current signal.

3. The adjustable bandwidth transimpedance amplifier of claim 2 wherein the current mirror is formed by two gate coupled FETs.

4. The adjustable bandwidth transimpedance amplifier of claim 3 wherein the current mirror is coupled to a voltage-to-current converter.

5. A receiver optical subassembly including an adjustable bandwidth transimpedance amplifier, comprising:
   a photodiode configured to receive an optical data signal;
   an adjustable bandwidth transimpedance amplifier with an input coupled to an output of photodiode;
   the adjustable bandwidth transimpedance amplifier comprising an amplifier receiving a current signal with a feedback path coupling an input and an output of the amplifier;
   a selectable resistance in the feedback path, resistance of the selectable resistance controlled by a control signal, the selectable resistance comprises a plurality of resistances, the plurality of resistances are switchably coupled to feedback path, the plurality of resistances comprise a plurality of resistors, the plurality of resistors coupled in series and at least some of the resistors each have a switch coupled in parallel, the control signal determines whether the switches are open or closed, the control signal is coupled to a plurality of comparators, and an output of each comparator is coupled to a switch;
   a signal path coupled to the adjustable bandwidth transimpedance amplifier, the signal path providing a pathway for a control signal for adjusting bandwidth of the adjustable bandwidth transimpedance amplifier wherein at least a portion of the signal path is coupled to an output of the photodiode, the portion of the signal path providing a pathway for a current indication signal indicating current generated by the photodiode wherein the current indication signal is provided by a current mirror, and
   a further amplifier with an input coupled to an output of the adjustable bandwidth transimpedance amplifier and a dual output providing an output differential signal.

6. A method of operating a receiver optical subassembly, comprising:
   generating a current signal in response to a data bearing incoming light signal by a photodiode;
   providing the current signal to a transimpedance amplifier;
   forming a signal indicative of the current signal by a current mirror;
   placing the signal indicative of the current signal on a monitor/select pin;
   receiving a control signal on the monitor/select pin;
   adjusting a resistance of a feedback path of the transimpedance amplifier by utilizing a plurality of comparators to configure a plurality of switches coupled in parallel with a plurality of resistors, based on the control signal.

7. A five pin package including a photodiode and transimpedance amplifier comprising:
   a housing with a window
   a die within the housing;
   five pins coupled to the housing and electrically coupled to the die, a first pin of the five pins providing a ground pin and a second pin of the five pins providing a power pin;
   a photodiode within the housing and approximate the window, the photodiode positioned to receive light passing though the window;
   the die including an adjustable bandwidth transimpedance amplifier, with the photodiode electrically coupled to an input of the adjustable bandwidth transimpedance amplifier;
   the die further including a further amplifier with an input electrically coupled to an output of the adjustable bandwidth transimpedance amplifier and with two outputs forming a differential output, the differential output being coupled to a third pin of the five pins and a fourth pin of the five and a fifth pin of the five pins operatively coupled to a signal path for a current signal indicative of current generated by the photodiode and a feedback path of the adjustable bandwidth transimpedance amplifier to provide adjustment of a resistance of the feedback path, the fifth pin operatively coupled to the feedback path by at least one comparator, the resistance of the feedback path is a selectable resistance, and the output of the at least one comparator is coupled to the selectable resistance; and
   wherein the current signal indicative of current generated by the photodiode is provided by a current mirror.

8. The five pin package including a photodiode and a transimpedance amplifier of claim 7 wherein the fifth pin is also coupled to the current mirror, which is operatively coupled to an output of the photodiode.

9. The five pin package including a photodiode and a transimpedance amplifier of claim 8 wherein the signal for providing adjustment of the bandwidth of the adjustable bandwidth transimpedance amplifier is a voltage signal.

10. The five pin package including a photodiode and a transimpedance amplifier of claim 9 wherein the current mirror is formed by two gate coupled FETs.

11. The five pin package including a photodiode and a transimpedance amplifier of claim 10 wherein the current mirror is coupled to a voltage-to-current converter.

* * * * *

UNITED STATES PATENT AND TRADEMARK OFFICE
CERTIFICATE OF CORRECTION

| | | |
|---|---|---|
| PATENT NO. | : 7,657,191 B2 | Page 1 of 1 |
| APPLICATION NO. | : 11/060061 | |
| DATED | : February 2, 2010 | |
| INVENTOR(S) | : Killmeyer et al. | |

It is certified that error appears in the above-identified patent and that said Letters Patent is hereby corrected as shown below:

At Column 1, Line 21, After "information" insert --,--

At Column 5, Line 27, Delete "FETS" and insert --FETs--

At Column 7, Line 35, Delete "mirror" and insert --mirror;--

At Column 8, Line 12, Delete "though" and insert --through--

At Column 8, Line 22, After "five" insert --pins;--

Signed and Sealed this

Sixth Day of July, 2010

David J. Kappos
*Director of the United States Patent and Trademark Office*